United States Patent [19]
Siddiqui et al.

[11] Patent Number: 6,163,555
[45] Date of Patent: Dec. 19, 2000

[54] REGULATION OF EMISSION FREQUENCIES OF A SET OF LASERS

[75] Inventors: Ahmed Shamim Siddiqui; Jason J Lepley, both of Colchester, United Kingdom

[73] Assignee: Nortel Networks Limited, Montreal, Canada

[21] Appl. No.: 09/097,129

[22] Filed: Jun. 12, 1998

[51] Int. Cl.$^7$ ................................................. H01S 3/13
[52] U.S. Cl. ............................... 372/32; 372/32; 372/29; 372/102
[58] Field of Search ............................ 372/32, 29, 102

[56] References Cited

U.S. PATENT DOCUMENTS

| | | | |
|---|---|---|---|
| 4,398,293 | 8/1983 | Hall et al. ................................ | 372/32 |
| 4,591,372 | 5/1986 | Bricheno et al. . | |
| 4,829,533 | 5/1989 | Hallberg et al. ......................... | 372/29 |
| 4,896,327 | 1/1990 | Ebberg ..................................... | 372/32 |
| 5,347,525 | 9/1994 | Faris ........................................ | 372/19 |
| 6,009,111 | 12/1999 | Corwin et al. ............................ | 372/32 |

OTHER PUBLICATIONS

F. Bertinetto and P. Gambini, Stabilization of the Emission Frequency of 1.54 m DFB Laser Diodes to Hydrogen Iodide, Apr. 1993, IEEE Photonic Technology Latters, vol. 4, No. 4, pag 472–474.

Journal of Lightwave Technology vol. 7 No. 10, Oct. 1989 Multiwave sources using laser diodes frequency–locked to atomic resonances—Michel Tetu et al.

IEEE Photonics Technology Letters vol. 1 No. 10, Oct. 1989 Frequency–Stabilized DFB laser module using 1.53159 $\mu$m absorption line of $C_2H_2$—Shoichi Sudo et al.

IEEE Photonics Technology Letters, vol. 8 No. 2, Feb. 1996 Proposal of a multiplex optical frequency comb generation system—T Saitoh, et al.

Journal of Lightwave Technology vol. 13 No. 10, Oct. 1995 Frequency Stabilized 622–Mb/s 16–Channel Optical FDM system and its performance in 1.3/1.55–$\mu$m zero dispersion fiber transmission Takashi Mizuochi et al.

ICAPT'96 Montreal, Jul. 29–Aug. 1, 1996 Paper entitled 'Fully–packaged, self–calibrated, absolute optical frequency controlled based on a surface–emitting nonlinear semiconductor waveguide: applications to multifrequency optical communication system'—Martin Guy et al.

Applied Optics vol. 36 No. 9 Mar. 20, 1997 'Simple, inexpensive wavemeter implemented with a fused fiber coupler' Timothy E Dimmick & Jane Weidner.

*Primary Examiner*—Frank G. Font
*Assistant Examiner*—Delma R. Flores Ruiz
*Attorney, Agent, or Firm*—Lee, Mann, Smith, McWilliams, Sweeney & Ohlson

[57] ABSTRACT

In an optical frequency comb generator the emission frequency of each one of the set of output lasers is repetitively aligned with an associated one of a set of specifically determined frequencies by comparison of that emission frequency with a frequency indicated by an optical frequency meter. The optical frequency meter is repetitively re-calibrated by reference to the emission frequency of each of at least two frequency tuneable calibration lasers emitting at respectively different frequencies. Each of the calibration lasers has its emission frequency continuously or repetitively aligned with the frequency of an associated spectral absorption line frequency standard.

9 Claims, 4 Drawing Sheets

REGULATION OF EMISSION FREQUENCIES OF A SET OF LASERS

BACKGROUND TO THE INVENTION

The first attempts to stabilise the frequency of a semiconductor laser diode began shortly after the successful CW operation of such laser diodes. The field received little interest until the end of the 1970's with the proposal of coherent-type optical fibre communications, which required highly coherent semiconductor lasers. Much of the research through the 1980's was aimed at coherent communications, however in the early 1990's, when the prospect of commercial WDM systems became a reality the emphasis shifted to frequency stabilisation for DWDM. This emphasis was fuelled by the introduction of proposed standardisation by the ITU in 1993, and recent efforts have been directed towards achieving practical standardised multichannel sources.

Locking the emission wavelengths of several lasers to different absorption lines in a species of gas received some attention. Thus an article by Têtu et al entitled, 'Multiwavelength sources Using Laser Diodes Frequency-Locked to Atomic Resonances', Journal of Lightwave Technology, Vol. 7, No. 10, October 1989, pp 1540–8, discloses the idea of locking the emission wavelengths of laser diodes to the wavelengths of selected atomic transitions in rubidium. That article explains that by adding foreign gas and altering the environment the authors were able to shift the peak wavelength of these resonances over a short region. Also by offset frequency locking of the lasers (i.e. use of a constant microwave beat-signal) the authors were able to achieve a small degree of control over the locked wavelength. This scheme gave channel separations of a few GHz or less, stabilised to a primary standard. However the spectral separation of the atomic lines is irregular and in the region of 0.811 $\mu$m. An article by Sudo et al entitled, 'Frequency-Stabilized DFB Laser Module Using 1.53159 $\mu$m Absorption Line of $C_2H_2$', IEEE Photonics Technology Letters, Vol. 1, No. 10, October 1989, pp 181–4, describes a similar scheme, but locking instead to the wavelengths of individual absorption lines of molecular acetylene. This has the advantage that these lines lie in the 1.5 $\mu$m window and have a line separation in the region of 70 GHz. However, the line spacing is not perfectly constant: the separation converges at shorter wavelengths.

The devices described in the preceding paragraph are employed to generate a frequency comb filter, and then the emission frequencies of lasers are brought into alignment with the frequencies that register with the 'teeth' of that comb. An alternative approach is to generate a comb of emission frequencies from a source emitting at a single frequency. Optical frequency comb generators are capable of producing an equally spaced comb of frequencies from a single source, over demonstrated ranges in excess of 2 THz, as for instance described by T Saitoh et al in the paper entitled, 'Proposal of a Multiplex Optical frequency Comb Generation System', IEEE Photonics Technology Letters, Vol. 8, No. 2, February 1996, pp 287–9. If the source of such a comb generator is primary stabilised, the possibility of locking an array of lasers to these lines exists. The spacing of the 'teeth' of the comb is set by an electro-optic modulator, and is therefore restricted to the capabilities of the microwave oscillator circuit (realistically ~-IOGHz). this makes the technique well suited for coherent systems, but less suitable for DWDM systems operating with a significantly larger channel separation, and moreover has the disadvantage of requiring a highly complicated set-up.

Frequency stabilisation techniques involving the use of scanning Fabry-Pérot interferometers have also been described, for instance by T Mizuochi et al in the paper entitled, 'Frequency Stabilized 622-Mb/s 16-Channel Optical FDM System and its Performance in 1.3/1.55-$\mu$m Zero-Dispersion Fiber Transmission', Journal of Lightwave Technology, Vol. 13, No. 10, October 1995, pp 1937–47. In theory such an instrument is capable of a settable channel spacing, and can also be configured to work with any primary reference. However they have the disadvantage of involving the use of expensive opto-mechanical scanning Fabry-Pérot interferometers and a highly accurate timing mechanism. The emission frequency of an optical source may also be calibrated against that of a source emitting at a known frequency by the method described by M Guy et al in a paper presented at ICAPT '96, Montreal, Jul. 29–Aug. 1, 1996, entitled, 'Fully-Packaged, Self-Calibrated, Absolute Optical Frequency Controller based on a Surface-Emitting Nonlinear Semiconductor Waveguide: Applications to Multifrequency Optical Communication'. This method uses a non-linear surface emitting device in a frequency meter configuration. The device emits the sum frequency of two orthogonally polarised beams at an angle proportional to the frequency difference between those beams. If one of the beams is a primary referenced laser, then the device operates as an absolute frequency meter. The angle is detected by free-space illumination of a detector array (CCD) that is analysed by a microcontroller to calculate the optical frequency. The stated accuracy of this device is sub-GHz at 1300 nm, but at 1550 nm is in the order of 4 GHz. This instrument is capable of calibrating itself to any two or more primary references in the 1550 nm window. Although the instrument is self-calibrating, the use of free-space optics is liable to make it less robust than instruments in which the optical propagation is waveguided throughout, and the components are relatively new technology and therefore expensive.

A much more simple and relatively inexpensive form of optical wavemeter is described by T Dimmick et al in the paper entitled, 'Simple, inexpensive Wavemeter Implemented with a Fused Fiber Coupler', Applied Optics, Vol. 36, No. 9, Mar. 20, 1997, pp 1898–1901. This instrument relies for its operation upon the wavelength sensitivity of the coupling provided by a fused fibre coupler. The input power applied to the input of this coupler is shared between its two outputs in ratio that is determined by the wavelength (frequency) of that input signal. The two outputs are coupled to a matched pair of photodetectors, and the electrical outputs of these two photodetectors are fed to the two inputs of a differential logarithmic amplifier. Initial calibration of the instrument was provided by first supplying it with light from a tuneable laser that itself has been previously calibrated in some unspecified manner. It is tacitly assumed that this calibration remains valid for the duration of the future use of the instrument.

SUMMARY OF THE INVENTION

The present invention is directed to the provision of an absolutely calibrated optical frequency comb generator, and method regulating the frequencies that it emits, and whose method of absolute calibration is not specific to any particular primary frequency standard (or group of two or more of such standards).

It is desirable for the instrument and its method of operation to be capable of simple reconfiguration to alter the channel spacing of the emitted frequencies and, if desired, to allow for the possibility of that channel spacing to be non-uniform through the spectral range of the instrument.

Meeting of these objectives builds in a certain degree of adaptability for meeting future requirements, for instance by allowing for the possibility of using alternative frequency references in the 1.55 μm window (or even the use of references outside this window with the possibility of translating this accuracy to 1.5 μm by various means). An instrument that is inherently independent of the primary reference to which it is calibrated is therefore advantageous. A further point is that with advances in optical technology it may prove feasible to increase the density of WDM systems further, for instance to 50 GHz or less, and so an instrument that is readily reconfigurable to different channel spacings is also to be preferred.

Other features include the avoidance of having to rely upon microwave frequency electronics, of having to dither the emission frequencies of the channel output lasers of the instrument, and of having to rely upon any free-space optics other than that employed for coupling light through an absorption cell.

A preferred form of optical frequency meter is one that includes a component that shares an optical signal applied to an input of that component between two outputs of that component in a frequency dependent ratio. Such a component is preferably constituted by a wavelength multiplexing 2×2 optical waveguide coupler feeding a matched pair of photodiodes.

Other features and advantages of the invention will be readily apparent from the following description of preferred embodiments of the invention, the drawings and the claims.

DETAILED DESCRIPTION OF A PREFERRED EMBODIMENT

In its simplest from, the emission frequency of each of a set of frequency tuneable lasers is repetitively measured using a frequency meter, and that measure is used to bring the emission frequency of that laser into alignment with a predetermined ratio for that particular laser. The meter is repetitively calibrated against the emission frequencies of two or more frequency tuneable calibration lasers. Feedback control is employed to lock the emission frequency of each calibration laser with the respective frequency of an associated spectral absorption line frequency standard. As an alternative to using two or more calibration lasers, each tuned to its own emission frequency, a single calibration laser may be used that is cyclically tuned in turn to the frequency of each of two or more frequency standard spectral absorption lines.

Figure 1:
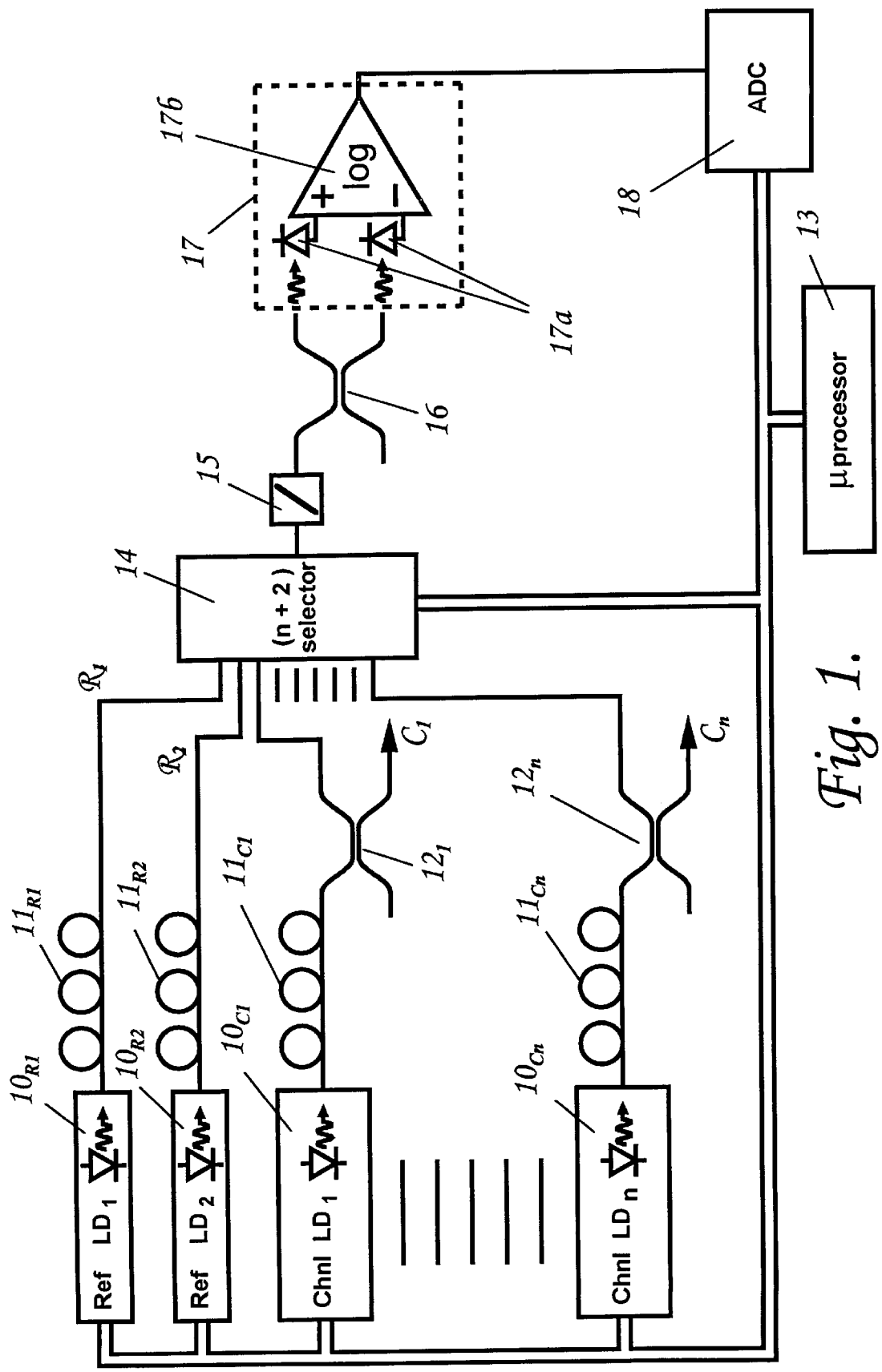
FIG. 1 is a general schematic diagram of a comb generator embodying the invention in a preferred form.

Reference will now be made in detail to specific features of a preferred embodiment of the invention. Referring to FIG. 1, an n-channel optical frequency comb generator has a set of 'n' frequency tuneable laser diodes $10_{C1}$ to $10_{Cn}$ (additionally identified in FIG. 1 as laser diodes Chnl $LD_1$ to Chnl $LD_n$) connected, via associated state of polarisation (SOP) adjusters $11_1$ to $11_n$ and optical taps $12_1$ to $12_n$, to a set of output ports $C_1$ to $C_n$. The emission frequency of each laser diode $10_C$ is separately regulated by means of a microprocessor 13 which controls the drive currents applied to each laser diode and the temperature to which that laser diode is stabilised. Each tap 12 directs most of the power emitted by its laser diode to its associated output port C, but directs a small proportion to an associated one of (n+2) input ports of a selector 14. The selector 14 operates, under the control of the microprocessor 13, to connect each of its inputs serially with its single output port. The output port of the selector 14 is connected to the input of a frequency meter that consists of a polariser 15, a wavelength sensitive 2×2 optical waveguide coupler 16, and a logarithmic ratio detector indicated generally at 17. The electrical output of the logarithmic ratio detector 17 is fed to an analogue-to-digital (A-to-D) converter 18 that provides a control signal input to the microprocessor 13. Thus far in this specific description, 'n' out of the (n+2) input connections to the selector 14 have been accounted for. The two remaining inputs are inputs $R_1$ and $R_2$ respectively from two frequency tuneable reference laser diodes $10_{R1}$ and $10_{R2}$ (additionally identified in FIG. 1 as laser diodes Ref $LD_1$ and Ref $LD_2$) via SOP adjusters $11_{R1}$ and $11_{R2}$.

The 2×2 optical waveguide coupler 16 is typically a tapered fused fibre optical waveguide coupler, only three of whose four ports are actually used. It may be made from a pair of single mode optical fibres by the progressive stretching method described in the specification of U.S. Pat. No. 4,591,372. Light launched into the coupler from the selector 14 is shared between its two output ports in a ratio determined by the frequency of that light. The strength of the wavelength sensitivity is dependent upon the extent to which the cross-section of the fibres is reduced in the drawn-down region, and the length of that drawn-down section. In this particular example, the laser diodes $C_1$ to $C_n$ are designed to emit in a waveband extending from about 1535 nm to about 1565 nm, for which a suitable strength of coupling is that which produces power transfer, from coupling substantially exclusively with one of the output ports to coupling substantially exclusively with the other, over a wavelength range from about 1520 nm to about 1585 nm. The proportion of the input power that is coupled into either particular one of the two output ports varies with frequency according to a sin relationship, and so, over the 1535 to 1565 nm range of interest, this value of coupling strength provides a near-linear relationship between the frequency of light applied to the coupler 16 and the electrical output of the logarithmic ratio detector 17. In the foregoing analysis it has been tacitly assumed that the coupling strength of the coupler 16 is independent of SOP, but typically this is not the case. It is for this reason that the frequency meter includes a polariser 15. This polariser is aligned with one of the two orthogonal SOPs for which the coupling strength is single-valued. The SOP adjusters 11 are provided so as to be able to ensure that the tapped portion of light from each laser diode fed to the selector is not totally blocked by the polariser 15.

The logarithmic ratio detector 17 has a matched pair of photodiodes 17a optically coupled with the outputs of the coupler 16. The electrical outputs of these photodiodes are fed to a logarithmic amplifier 17b.

Once the wavelength meter, comprising the polariser 15 together with the coupler 16 and the logarithmic ratio detector 17, has been calibrated, the outputs of the laser diodes $10_C$ can be connected in turn to the wavelength meter by the selector 14 under the control of the microprocessor 13. The meter will then provide an output in respect of each laser diode $10_C$ via the A-to-D converter 18 to the microprocessor for use by that processor in controlling the operation of that laser diode to restore alignment of its emission frequency with a predetermined value.

Calibration of the wavelength meter is obtained with the aid of the reference laser diodes $10_{R1}$ and $10_{R2}$. In their turn, these two laser diodes are calibrated against a spectral absorption line frequency standard. For use with a bank of channel laser diodes arranged to emit the wavelength range from about 1520 nm to about 1585 nm, the P(26) and P(11) absorption lines (respectively at 1548.821 nm and 1539.381 nm) in the absorption spectrum of $^{13}C_2H_2$ are well-placed as absorption lines against which to calibrate the reference laser diodes $10_{R1}$ and $10_{R2}$.

Figure 2:
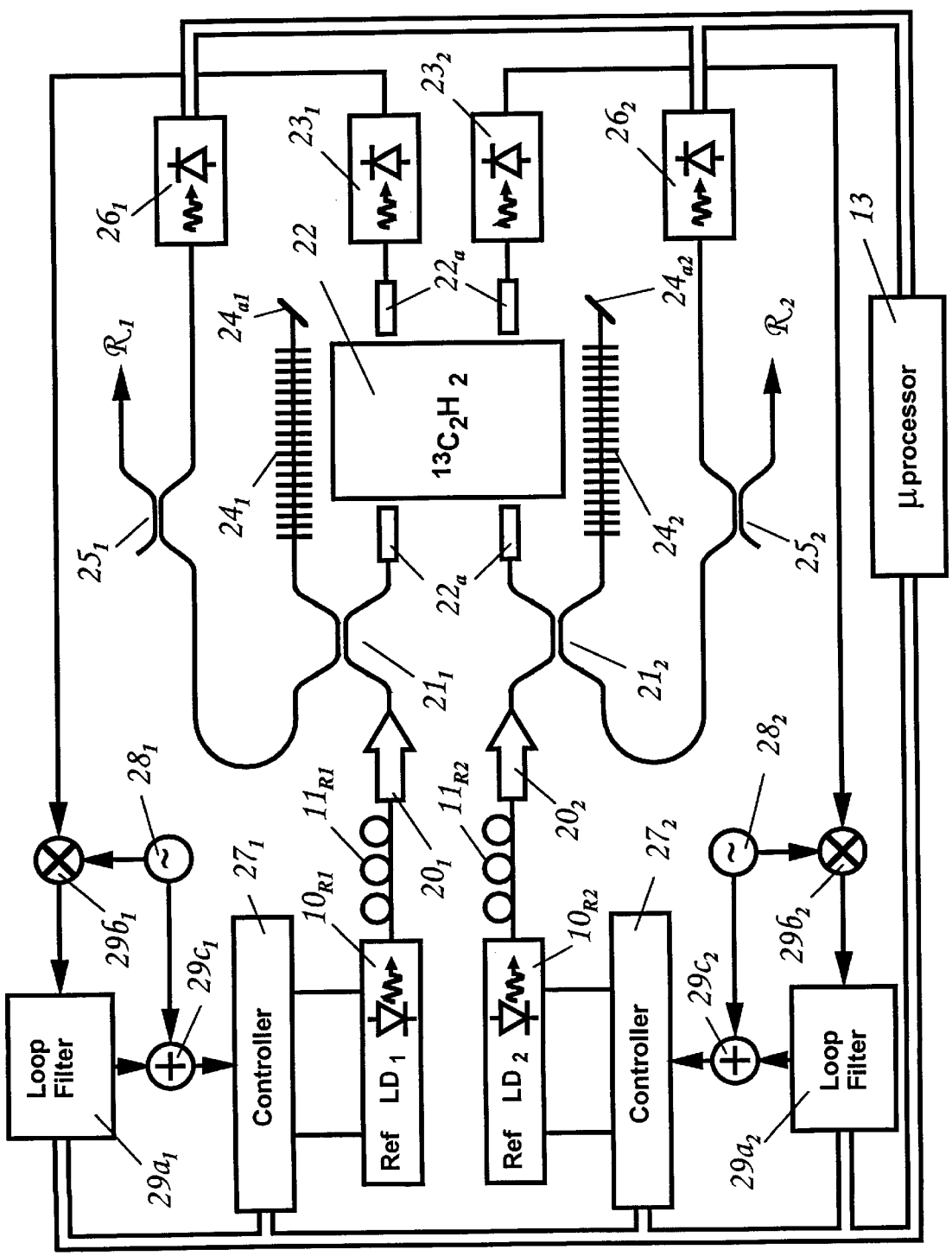
FIG. 2 is a schematic diagram showing greater details of how the reference laser diodes of the comb generator of FIG. 1 are stabilised.

The way the calibration of the reference laser diodes $10_{R1}$ and $10_{R2}$ is achieved will now be described with particular reference to FIG. 2 which shows certain additional details of the optical frequency comb generator which, for clarity, have been omitted from FIG. 1. Light from each reference laser diode $10_{R1}$, $10_{R2}$ is directed through its associated polarisation adjuster $11_{R1}$, $11_{R2}$ and an associated optical isolator $20_1$, $20_2$ to a to a 3 dB 2×2 optical fibre waveguide coupler $21_1$, $21_2$ which divides this light into two parts. One part is launched through a gas absorption cell 22, with the aid of collimating lenses 22a, and from there on to an associated photodetector $23_1$, $23_2$. The other part is launched into a length of single mode optical fibre provided with an associated narrow-band reflector constituted by a Bragg reflective grating $24_1$, $24_2$. Light that is reflected by this Bragg grating passes back through the associated optical fibre waveguide coupler $21_1$, $21_2$ which again divides the light into two parts. One of these parts is directed back to the associated optical isolator $20_1$, $20_2$, which blocks this part. The other part is directed into a further 2×2 optical fibre waveguide coupler $25_1$, $25_2$ that serves to abstract a portion of the light to form an associated input $R_1$, $R_2$ to the selector 14 (FIG. 1), while the remainder is directed to an associated photodetector $26_1$, $26_2$. Substantially all of the light that is launched into either Bragg reflector $24_1$, $24_2$, and that is not reflected by it, is absorbed in an associated absorber $24a_1$, $24a_2$.

Each of the two Bragg reflective gratings $24_1$ and $24_2$ has a narrow reflection-band that is approximately centered on a frequency corresponding to a different one of the spectral absorption lines of the gas in the gas cell 22 (for instance, when using the absorption spectrum of $^{13}C_2H_2$, the absorption lines at 1538.8 nm and 1548.82 nm). The reflection-band is wide enough to be certain of registering with that particular absorption line, and narrow enough to be certain of not registering with any of the other lines. The emission wavelength of each of the reference lasers $10_{R1}$, $10_{R2}$ is regulated by an associated electrical controller $27_1$, $27_2$ that regulates the laser's drive current and/or temperature. The outputs of the photodetectors $26_1$, $26_2$ are employed by the microprocessor 13 for coarse regulation of the controllers so as to bring the emission frequency of their respective reference lasers into alignment with the reflection bands of the respective Bragg reflectors $24_1$, $24_2$. This coarse frequency alignment is sufficient in each instance to distinguish the frequency of the absorption line of the gas cell 22 to which that laser is selected to be stabilised from all the other absorption lines of the cell. Fine scale frequency alignment with the selected absorption line is then effected with an associated oscillator $28_1$, $28_2$ and feedback control loop comprising a loop filter $29a_1$, $29a_2$ multiplier $29b_1$, $29b_2$ and summer $29c_1$, $29c_2$. These feedback control loops utilise the fact that the electrical outputs of the photodetectors $23_1$, $23_2$ have a frequency component at the frequency of their respective oscillators $28_1$, $28_2$ the phase of which changes sign as the emission frequency of the associated reference laser is swept through the frequency of peak absorption of the selected absorption line.

To get from knowledge of the power sharing ratio at two specific wavelengths (or frequencies) in order to calculate the power sharing ratio at some other wavelength (or frequency) requires knowledge of the fundamental relationship between power sharing ratio and wavelength (or frequency) afforded by the 2×2 optical fibre waveguide coupler 16. According to simple theory, the power sharing should be governed by the relationship $$\eta = \sin^2\left[\frac{\pi}{2} \cdot \frac{v - v_1}{v_2 - v_1}\right]$$

where $\eta$ is the fraction of the input power coupled to one of the output ports of the coupler 16 [and $(1-\eta)$ is the fraction coupled to the other output port], where $v_1$ is a frequency at which $\eta=0$, $v_2$ is the next higher frequency at which $\eta=1$, and $v$ is an optical frequency lying between $v_1$ and $v_2$. Following from this, simple theory predicts $$V_m K_1 \cdot \log\left\{\frac{\sigma_a}{\sigma_b} \cdot \tan^2\left[\frac{\pi}{2} \cdot \frac{v - v_1}{v_2 - v_1}\right]\right\} + K_2$$

where $V_m$ is the output of the log amplifier 17b, $K_1$ is the amplifier gain, $\sigma_a$, $\sigma_b$ are the responsivities of the two photodetectors 17a, and $K_2$ is another constant determined at least in part by the voltage offset of the amplifier.

At frequencies near the mid-point between $v_1$ and $v_2$, the relationship between $V_m$ and $v$ is approximately linear, but the approximation is not so close for departures from linearity to be safely ignored. Accordingly, before the comb generator is brought into service, a wavemeter is employed to determine the relationship between $V_m$ and a scale of frequency (or wavelength) expressed in terms of some arbitrary units (AUs). In operation of the comb generator, the measured values of $V_m$ afforded to the emissions of the reference laser diodes $10_{R1}$ and $10_{R2}$ then enable the arbitrary unit (AU) scale to be calibrated, on a repetitively updated basis, in absolute frequency (or wavelength) terms defined by the primary frequency (or wavelength) standard of the absorption lines to which those reference lasers are locked.

Figure 3:
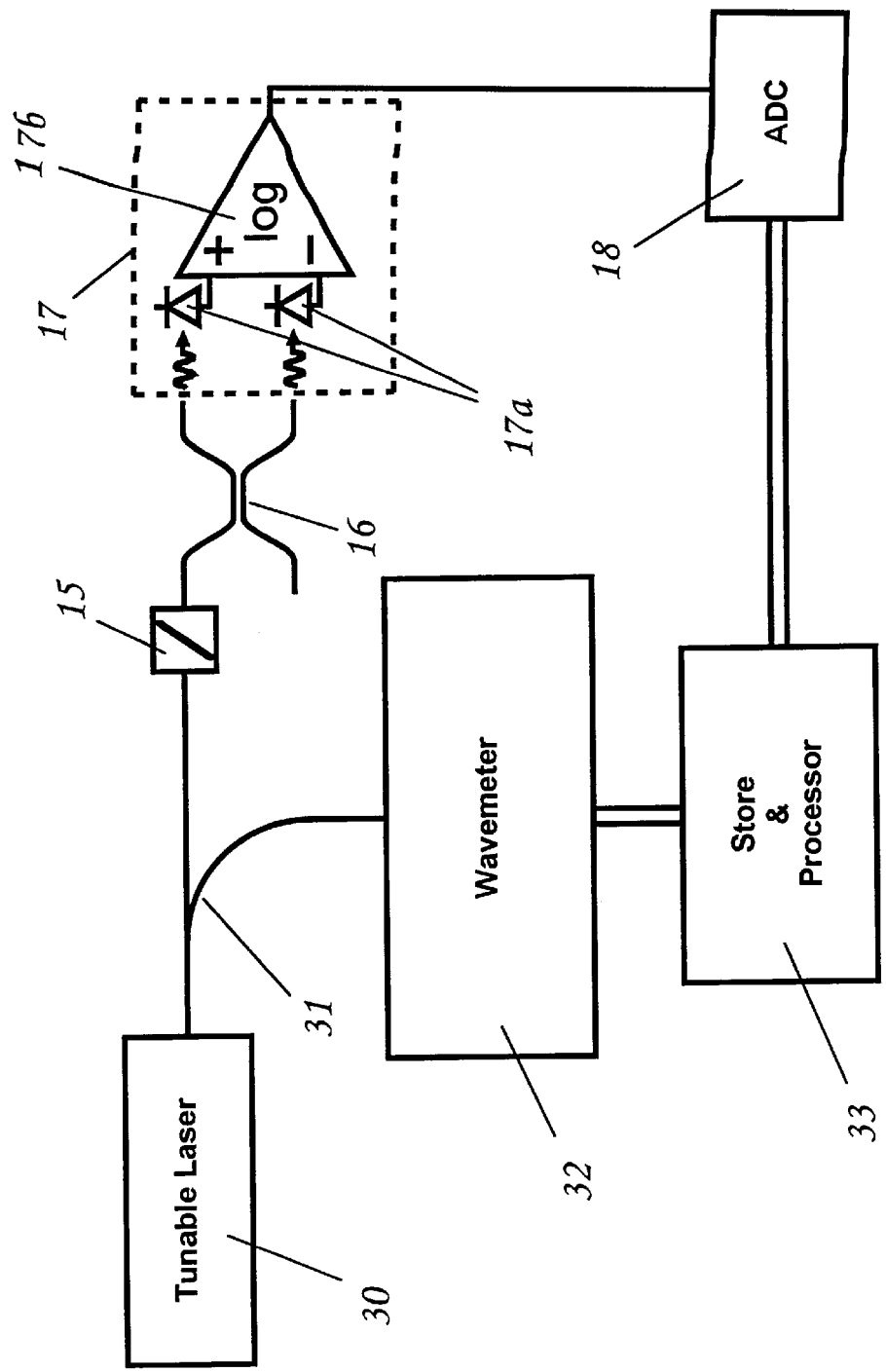
FIG. 3 is a schematic diagram of apparatus employed in the initial calibration of a frequency/wavelength sensitive element of the comb generator of FIGS. 1 and 2.
Figure 4:
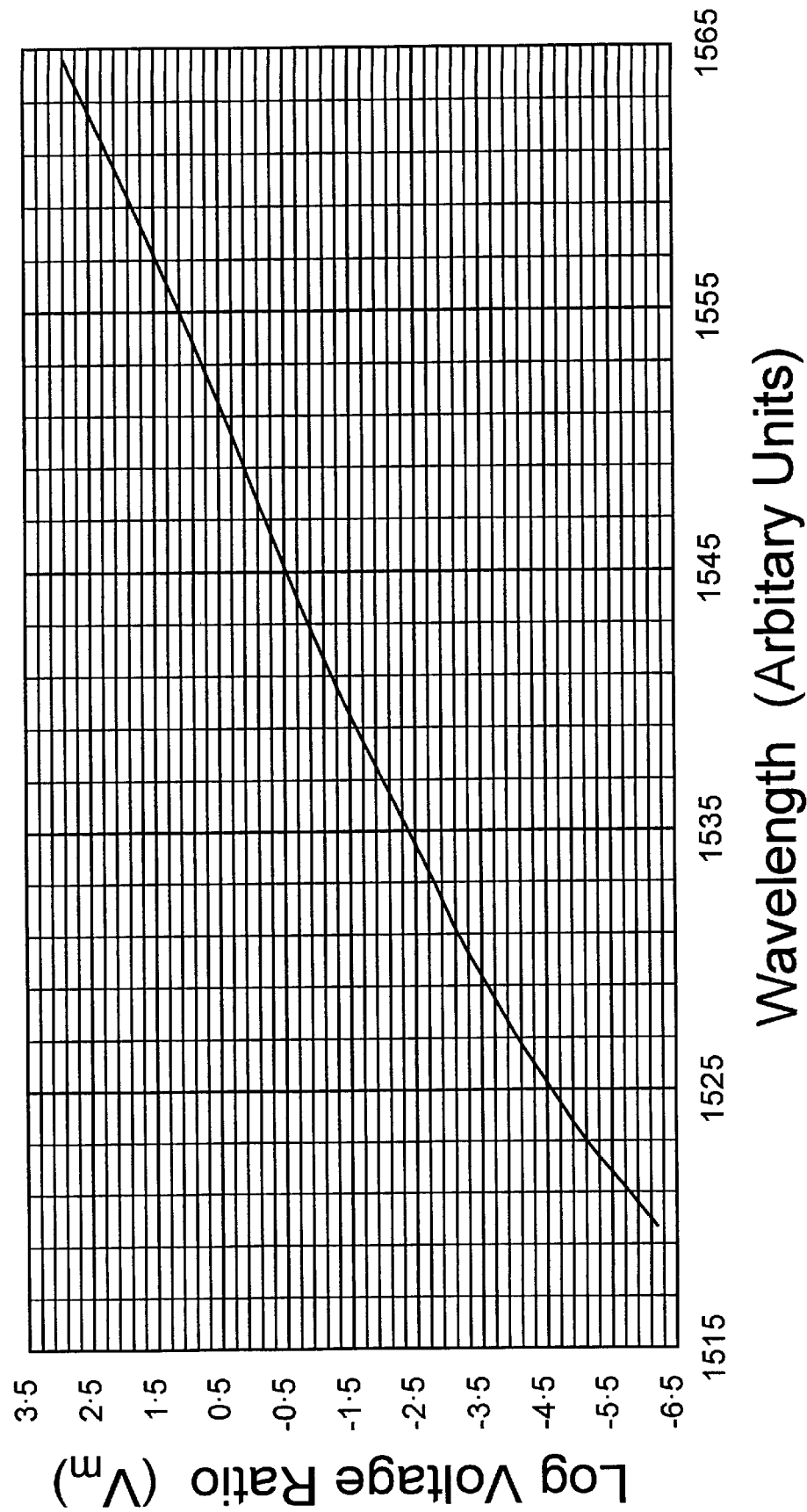
FIG. 4 is a graphical representation of the measured relationship between the wavelength of light applied to the element of FIG. 3 and the electrical output derived from detection of the optical output of that element.

The calibration of $V_m$ in terms of AUs may conveniently be effected using the apparatus of FIG. 3. Here the connection from the (n+2) selector 14 (of FIG. 1) to the polariser 15 is substituted, on a temporary basis, by a connection to the polariser 15 from a tunable laser source from which optical power is also taken via a tap 31 to provide an input to a wavemeter 32 calibrated in arbitrary units (AUs). The output of the A-to-D converter 18, and that of the wavemeter 32, are fed to a data storage and processing device 33. Under the control of the wavemeter 32, the tunable laser 30 is stepped in uniform AU increments of frequency or wavelength through the spectral range of interest, and the corresponding values of $V_m$ are stored. In respect of a particular optical fibre waveguide coupler 16, the measured relationship between $V_m$ and AUs, one practical example of which is graphically illustrated in FIG. 4, may be stored in the microprocessor in the form of a look-up table. Alternatively, and generally preferably, the data may be stored in the microprocessor in the form of an analytical expression whose constants have been determined by fitting the data to a particular analytical solution, such as the equation developed two paragraphs earlier, or having been fitted to a generalised analytical solution, such as a truncated (e.g. up to tenth order) Taylor series standard polynomial expansion.

Then, assuming that a linear relationship exists between the AU scale and the primary referenced unit (PRU) scale (units of frequency or of wavelength), the constant of proportionality and intercept values relating these scales can be readily re-evaluated each time the values of $V_m$ afforded to the emissions of the reference laser diodes $10_{R1}$ and $10_{R2}$ are re-measured, thereby affording a refreshing of the calibration of the $V_m$ scale in terms of the primary referenced units of frequency or wavelength.

Apart from the feature of repetitive re-calibration that is possessed by the comb generator described above, one of the particular features is that the specific frequencies or wavelengths at which the channel laser diodes $10_{C1}$ to $10_{Cn}$ are constrained to emit are determined under the control of the microprocessor 13, and so they are very readily resettable anywhere within the spectral range defined by the waveguide coupler 16 as calibrated by the laser diodes $10_{R1}$ and $10_{R2}$. The value of the particular frequency or wavelength to which each channel laser is set is adjustable independently of the settings of the other channel lasers. Accordingly the 'teeth' of the 'comb' of the comb generator are not constrained to be uniformly spaced in either the frequency domain or the wavelength domain.

Generally it will be preferred to use a different laser $10_{R1}$, $10_{R2}$ for generating each of the reference signals employed for calibration. It should however be appreciated that only one of these reference lasers is actually required, provided that that reference laser can satisfactorily be switched in a cyclic manner in such a way that its emission is stabilised in turn at each of the required primary referenced frequencies or wavelengths.

What is claimed is:

1. A method of regulating the emission frequencies of a set of frequency tuneable output lasers, in which method, the emission frequency of each one of the set of output lasers is repetitively aligned with an associated one of a set of specifically determined frequencies by comparison of that emission frequency with a frequency indicated by an optical frequency meter, the optical frequency meter is repetitively re-calibrated by reference to the emission frequency of each of at least two frequency tuneable calibration lasers emitting at respectively different frequencies, and each of the calibration lasers has its emission frequency continuously or repetitively aligned with the frequency of an associated spectral absorption line frequency standard.

2. A method as claimed in claim 1, wherein the optical frequency meter operates by sharing an optical signal applied to a component of the meter between two outputs of that component in an optical frequency dependent ratio.

3. A method of regulating the emission frequencies of a set of frequency tuneable output lasers, in which method, the emission frequency of each one of the set of output lasers is repetitively aligned with an associated one of a set of specifically determined frequencies by comparison of that emission frequency with a frequency indicated by an optical frequency meter, the optical frequency meter is repetitively re-calibrated by reference to at least two reference frequencies generated in cyclic sequence by a frequency tuneable reference frequency laser, and the calibration laser is repetitively re-tuned to restore alignment of its emission frequency in turn with the frequency of each of at least two different spectral absorption line frequency standards.

4. A method as claimed in claim 3, wherein the optical frequency meter operates by sharing an optical signal applied to a component of the meter between two outputs of that component in an optical frequency dependent ratio.

5. A generator of a set of stabilised optical frequencies, which generator has a set of emission frequency tuneable output lasers, a set of at least two emission frequency tuneable calibration lasers, an optical frequency meter, a spectral absorption lines optical frequency standard, and a controller adapted repetitively to re-tune the emission frequencies of the output lasers to associated specifically determined frequencies indicated by the optical frequency meter, repetitively to re-calibrate the frequency meter by reference to the emission frequencies of the calibration lasers, and continuously or repetitively to realign the emission frequency of each one of the calibration lasers with an associated one of the spectral absorption lines of the optical frequency standard.

6. A generator as claimed in claim 5, wherein the optical frequency meter includes an optical component which shares an optical signal applied to the component between two outputs of the component in an optical frequency dependent ratio.

7. A generator of a set of stabilised optical frequencies, which generator has a set of emission frequency tuneable output lasers, an emission frequency tuneable calibration laser, an optical frequency meter, a spectral absorption lines optical frequency standard, and a controller that is adapted repetitively to re-tune the emission frequencies of the output lasers to associated specifically determined frequencies indicated by the optical frequency meter, repetitively to re-calibrate the frequency meter by reference to emission frequencies emitted cyclically in turn the calibration laser, and repetitively to realign the emission frequency of the calibration laser in turn with at least two different spectral absorption lines of the optical frequency standard.

8. A generator as claimed in claim 7, wherein the optical frequency meter includes an optical component which shares an optical signal applied to the component between two outputs of the component in an optical frequency dependent ratio.

9. A method of operating a WDM transmission system having a plurality of data-modulated laser outputs of different frequency multiplexed on to a transmission path common to said outputs, in which method of operation the emission frequency of each one of said plurality of data-modulated laser outputs is repetitively aligned with an associated one of a set of specifically determined frequencies by comparison of that emission frequency with a frequency indicated by an optical frequency meter, the optical frequency meter is repetitively re-calibrated by reference to the emission frequency of each of at least two frequency tuneable calibration lasers emitting at respectively different frequencies, and each of the calibration lasers has its emission frequency continuously or repetitively aligned with the frequency of an associated spectral absorption line frequency standard.

* * * * *